(12) United States Patent
Gill et al.

(10) Patent No.: US 11,877,414 B2
(45) Date of Patent: Jan. 16, 2024

(54) ELECTRONIC COMPONENT MOUNTING

(71) Applicant: HEWLETT-PACKARD DEVELOPMENT COMPANY, L.P., Spring, TX (US)

(72) Inventors: Bradford Adam Gill, Tomball, TX (US); Tony Seokhwa Moon, Spring, TX (US); Derek Lee Goode, Spring, TX (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 166 days.

(21) Appl. No.: 17/451,282

(22) Filed: Oct. 18, 2021

(65) Prior Publication Data

US 2023/0121074 A1 Apr. 20, 2023

(51) Int. Cl.
| | |
|---|---|
| H05K 7/14 | (2006.01) |
| H05K 7/12 | (2006.01) |
| G06F 1/18 | (2006.01) |
| H01R 13/639 | (2006.01) |
| H01R 12/72 | (2011.01) |
| H05K 1/14 | (2006.01) |

(52) U.S. Cl.
CPC ............ *H05K 7/1417* (2013.01); *G06F 1/185* (2013.01); *H01R 12/721* (2013.01); *H01R 13/639* (2013.01); *H05K 1/141* (2013.01); *H05K 1/144* (2013.01); *H05K 7/12* (2013.01)

(58) Field of Classification Search
CPC ........ H05K 7/12; H05K 7/1417; H05K 1/141; H05K 1/144; G06F 1/185; H01R 12/721; H01R 13/639

USPC .......................................................... 361/600
See application file for complete search history.

(56) References Cited

U.S. PATENT DOCUMENTS

| | | | | |
|---|---|---|---|---|
| 6,971,899 | B1 * | 12/2005 | Liu ..................... | H01R 12/7029 |
| | | | | 439/326 |
| 7,134,895 | B1 * | 11/2006 | Choy .................. | H05K 7/1404 |
| | | | | 439/326 |
| 7,134,896 | B1 * | 11/2006 | Chen ................... | H05K 7/1404 |
| | | | | 439/326 |
| 10,645,794 | B1 * | 5/2020 | Chien ................. | H05K 1/0201 |
| 2007/0064404 | A1 | 3/2007 | Dean | |
| 2010/0165592 | A1 * | 7/2010 | Takao .................... | G06F 1/185 |
| | | | | 292/341.15 |
| 2014/0268539 | A1 | 9/2014 | Vega et al. | |

(Continued)

OTHER PUBLICATIONS

Carsten Frauenheim, Microsoft Surface Laptop 3 15" SSD Replacement downloaded Sep. 12, 2021 (15 pages).

(Continued)

*Primary Examiner* — Anatoly Vortman
*Assistant Examiner* — Zhengfu J Feng
(74) *Attorney, Agent, or Firm* — Knobbe, Martens, Olson & Bear, LLP

(57) ABSTRACT

In some examples, a tool-less electronic component retention apparatus includes a bracket to affix to a circuit board, and a spring-loaded arm attached to the bracket. The spring-loaded arm has an engagement tab that is angled downwardly to engage an upper surface of an electronic component to mount the electronic component to the circuit board. The spring-loaded arm is pivotable between an engaged position and a release position by a user without use of a tool.

17 Claims, 6 Drawing Sheets

(56) References Cited

U.S. PATENT DOCUMENTS

2019/0361506 A1* 11/2019 Keilers .................. G06F 1/186
2021/0168959 A1   6/2021 Xu et al.
2021/0267083 A1*  8/2021 Lyons .................. G06F 3/0679

OTHER PUBLICATIONS

Intel, Intel® Desktop Board DX79TO Product Guide, Order No. G44000-001, Oct. 2011 (86 pages).
Penn Engineering, Fasteners for Mounting Into Printed Circuit Boards, Sep. 9, 2021 (3 pages).
ZFIX, Lenovo ThinkPad Edge E530 DDR3 SODIMM SDRAM Replacement downloaded Sep. 12, 2021 (4 pages).

* cited by examiner

ELECTRONIC COMPONENT MOUNTING

BACKGROUND

An electronic device can include a circuit board on which various electronic components are mounted. Examples of electronic components include a processor, a storage device, a memory device, an input/output (I/O) device, and so forth.

BRIEF DESCRIPTION OF THE DRAWINGS

Some implementations of the present disclosure are described with respect to the following figures.

Figure 1A:
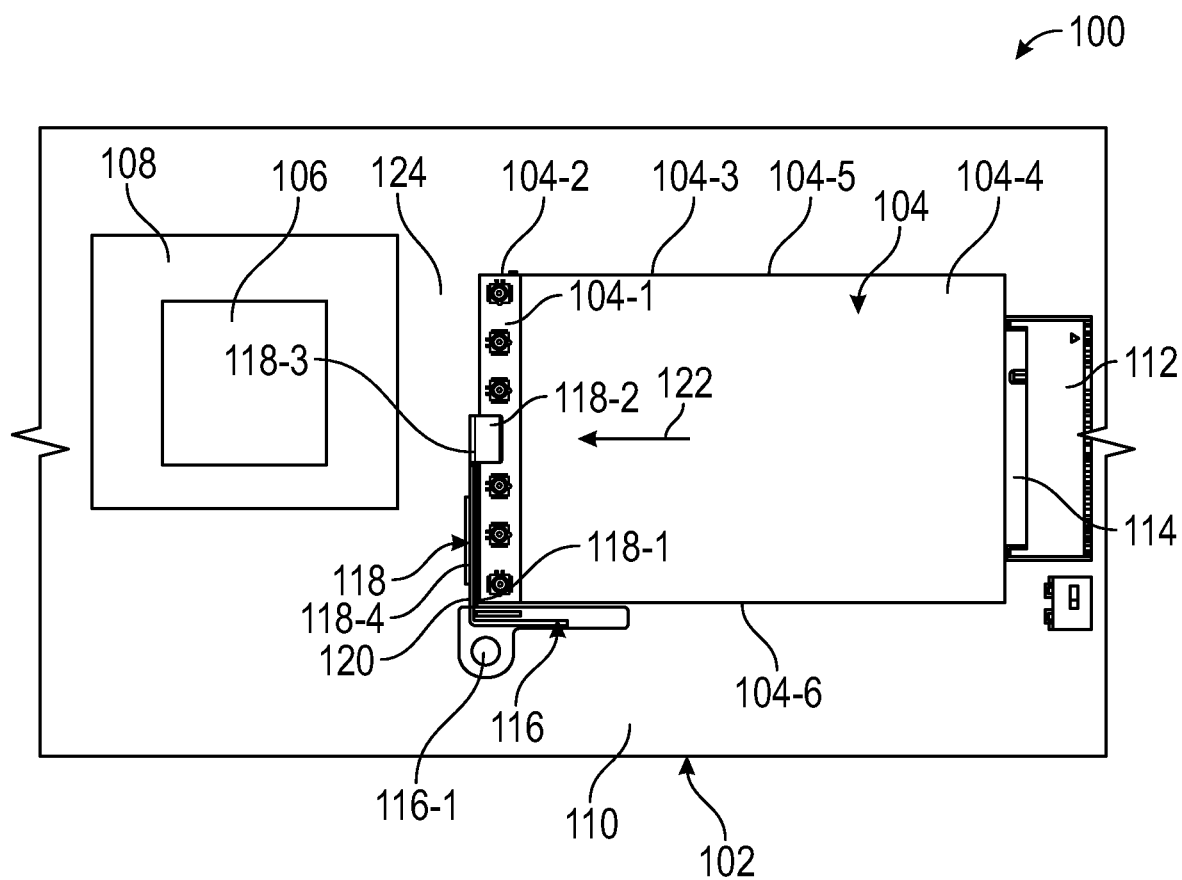
FIG. 1A is a top view of a circuit board assembly, according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

In some examples, a circuit board can include electrical connectors provided on a surface (or multiple surfaces) of the circuit board. For example, the electrical connectors can be in the form of sockets or other types of electrical connectors. A "circuit board" refers to a support structure that includes various layers, including electrically conductive traces in some of the layers to interconnect electronic components mounted to the circuit board.

In some cases, an electronic component connected to an electrical connector on the circuit board is attached to the circuit board using a tool-based attachment mechanism. For example, the tool-based attachment mechanism can include a fastener that extends into through-hole(s) of the electronic component and penetrate into the circuit board. The fastener can be in the form of a screw(s), bolt(s), standoff(s), etc., or a combination thereof. A "standoff" refers to a double-ended fastener to set a distance between two parts, where the standoff can include threaded ends (male and/or female).

A tool such as a screwdriver or another type of tool can be used to tighten fastener(s) into the circuit board. The fastener(s) may be located in region(s) of the circuit board that may interfere with electrically conductive traces in the circuit board that are used to interconnect electronic components. In some cases, a dense arrangement of electrically conductive traces may be located in certain region(s). If a fastener is located in a region with a dense arrangement of electrically conductive traces, then the fastener may cause a disruption in how the electrically conductive traces are routed in the circuit board.

In accordance with some implementations of the present disclosure, a tool-less attachment mechanism is used to attach an electronic component to a circuit board. In some examples, the electronic component can include an M.2 electronic component, such as a solid-state drive (SSD), a network card such as a wireless local area network (WLAN) card or a wireless wide area network (WWAN) card, or another electronic component. M.2 refers to a standard for internally mounted computer electronic components and associated connectors. M.2 specifies a form factor for electronic components, as well as locations of connectors and other circuitry. Certain portions of an M.2 electronic component may make up a "keep-out zone" that includes circuitry that external parts (including attachment mechanisms) are not to touch or otherwise interfere with. Attachment mechanisms according to some implementations of the present disclosure are arranged such that they would not interfere with keep-out zones of M.2 electronic components if used to attach the M.2 electronic components to circuit boards.

A tool-less attachment mechanism according to some implementations of the present disclosure allows a user to mount or dismount an M.2 electronic component without the use of any tool. Rather, the user can actuate the tool-less attachment mechanism using the user's finger(s) to lock or release the M.2 electronic component. The tool-less attachment mechanism also can be flexibly designed to avoid engagement with a keep-out zone of an M.2 electronic component when the tool-less attachment mechanism attaches the M.2 electronic component to a circuit board. Tool-less attachment mechanisms according to some implementations of the present disclosure do not have to conform to specific standards while still useable to attach M.2 electronic components to circuit boards.

Although reference is made to an "M.2 electronic component" in the present discussion, it is noted that techniques or mechanisms according to some implementations can be used with other types of electronic components in other examples.

Figure 1B:
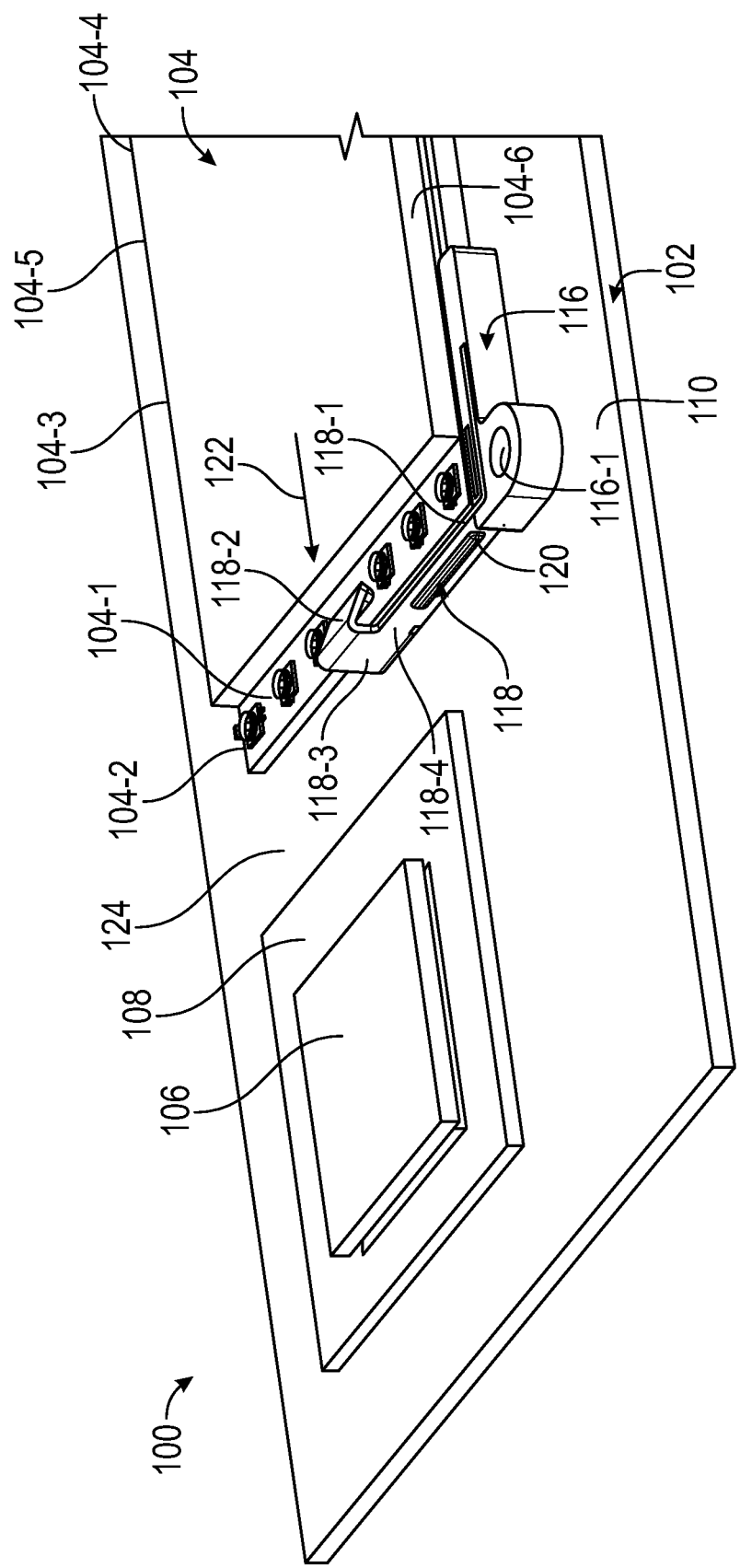
FIG. 1B is a perspective view of the circuit board assembly, according to some examples.

FIG. 1A is a top view of a circuit board assembly 100 that includes a circuit board 102 on which various electronic components are mounted. FIG. 1B is a perspective side view of a portion of the circuit board assembly 100.

The electronic components mounted on an upper surface 110 of the circuit board 102 include an M.2 electronic component 104 as well as other electronic components. Another electronic component can include a processor 106 or a different type of electronic component. The processor 106 can be mounted to a socket 108 that is attached to the upper surface 110 of the circuit board 102. In some examples, electronic components can also be mounted to a lower surface of the circuit board 102.

An electrical connector 112 for the M.2 electronic component 104 is also attached to the upper surface 110 of the circuit board 102. The M.2 electronic component 104 has a corresponding electrical connector 114 to electrically connect with the electrical connector 112.

A tool-less attachment mechanism depicted in FIGS. 1A-1B includes a bracket 116 and a spring-loaded arm 118 that is attached to the bracket 116. The bracket 116 is affixed to the upper surface 110 of the circuit board 102. The spring-loaded arm 118 is pivotable about a pivot point 120. In FIGS. 1A-1B, the spring-loaded arm 118 is in an engaged position with respect to the M.2 electronic component 104. In some examples, the spring-loaded arm 118 can be formed of a flexible material (e.g., a metal or another type of material) that is bendable such that if a force were to be applied in a direction indicated by an arrow 122, the spring-loaded arm 118 can be pushed backwardly and bend to rotate about the pivot point 120, which causes the spring-loaded arm 118 to move to a release position with respect to the M.2 electronic component 104.

In the engaged position, an engagement tab 118-2 of the spring-loaded arm 118 engages the M.2 electronic component 104 to fix the M.2 electronic component 104 with respect to the circuit board 102. In the release position, the engagement tab 118-2 of the spring-loaded arm 118 is moved away from the M.2 electronic component 104 to allow removal of the M.2 electronic component 104 from the circuit board 102. In a release position, the engagement tab 118-2 of the spring-loaded arm 118 does not engage an upper engagement surface 104-1 of the M.2 electronic component 104.

The spring-loaded arm 118 is "spring-loaded" in the sense that the spring-loaded arm 118 exhibits a spring-like behavior when bent. The elasticity of the spring-loaded arm 118 provides a return spring force such that after a force is applied to cause bending of the spring-loaded arm 118 about the pivot point 120, the spring-loaded arm 118 can return to its initial position due to the return spring force after the applied force is removed.

In other examples, the spring-loaded arm 118 can be formed of a rigid material that can rotate about a pivot pin or another type of pivot structure. A separate spring can be used to force the spring-loaded arm 118 back to its engaged position.

The spring-loaded arm 118 has a first end portion 118-1 that is attached to the bracket 116. The pivot point 120 is proximal the first end portion 118-1. The spring-loaded arm 118 further includes an engagement segment 118-3 at a second end portion (opposite the first end portion 118-1) at which the engagement tab 118-2 is provided. An elongated member 118-4 of the spring-loaded arm 118 extends between the first end portion 118-1 and the engagement segment 118-3.

The engagement tab 118-2 is an angled tab that is angled downwardly with respect to the upper engagement surface 104-1 of the M.2 electronic component 104.

In some examples, the M.2 electronic component 104 has an engagement section 104-2 and a main section 104-3. The engagement section 104-2 of the M.2 electronic component 104 is a section of the M.2 electronic component 104 to which an attachment mechanism (more specifically the spring-loaded arm 118 in FIGS. 1A-1B) can engage. The main section 104-3 of the M.2 electronic component 104 is a section of the M.2 electronic component 104 that includes circuitry of the M.2 electronic component 104. In examples according to FIGS. 1A-1B, the main section 104-3 has an upper surface 104-4 that is higher than the upper engagement surface 104-1 of the engagement section 104-2. In other examples, the upper engagement surface 104-1 of the engagement section 104-2 can be co-planar with the upper surface 104-4 of the main section 104-3, or can be higher than the upper surface 104-4 of the main section 104-3.

The main section 104-3 has side portions 104-5 and 104-6 that extend between a front end (proximal the engagement section 104-2) and a rear end (proximal the electrical connector 114) of the M.2 electronic component 104. The side portions 104-5 and 104-6 extend generally along a length of the M.2 electronic component 104, which is along a direction from the front end to the rear end of the M.2 electronic component 104. The side portions 104-5 and 104-6 that extend generally in parallel between the front end and the rear end of the M.2 electronic component. The side portions 104-5 and 104-6 of the M.2 electronic component 104 can extend generally in parallel along the length of the M.2 electronic component 104. The side portions 104-5 and 104-6 extend generally in parallel if a direction along which the side portion 104-5 extends is ±X° with respect to a direction along which the side portion 104-6 extends, where X is selected from among {0.5, 1, 1.5, 2, 5, 10, etc.).

The side portions 104-5 and 104-6 can be "keep-out zones" (of the M.2 electronic component 104) to which an attachment mechanism (such as the attachment mechanism including the bracket 116 and the spring-loaded arm 118) is not to engage.

In some examples, the bracket 116 can be formed of a material that is different from the material used to form the spring-loaded arm. For example, the bracket 116 can be formed of a plastic or another rigid material.

The bracket 116 includes a through-hole 116-1 through which a screw or another type of fastener can extend. The screw or another fastener can penetrate into the circuit board 102 to affix the bracket 116 to the circuit board 102. Once the bracket 116 is affixed to the circuit board 102, the bracket 116 is not moveable based on application of a force, such as the force in the direction indicated by the arrow 122.

The processor 106 (or another type of electronic component) that is positioned next to the M.2 electronic component 104 may have a relatively large number of pins extending along the four sides of the processor 106. These pins of the processor 106 are electrically connected (e.g., through the socket 108) to electrically conductive traces in the circuit board 102. As a result, in portions of the circuit board 102 adjacent the four sides of the socket 108, a relatively dense arrangement of electrically conductive traces can be provided in the circuit board 102.

In accordance with some implementations of the present disclosure, a location at which the bracket 116 is affixed to the circuit board 102, such as by a fastener through the through-hole 116-1, is away from the relatively dense arrangement of electrically conductive traces in regions of the circuit board 102 adjacent the four sides of the socket 108. For example, the bracket 116 is located away from the region 124 that is between the socket 108 and the M.2 electronic component 104. In this way, no penetrating fastener is provided that would extend through the region 124, which would not cause a disruption in how electrically conductive traces for the processor 106 are routed in the circuit board 102.

Figure 2:
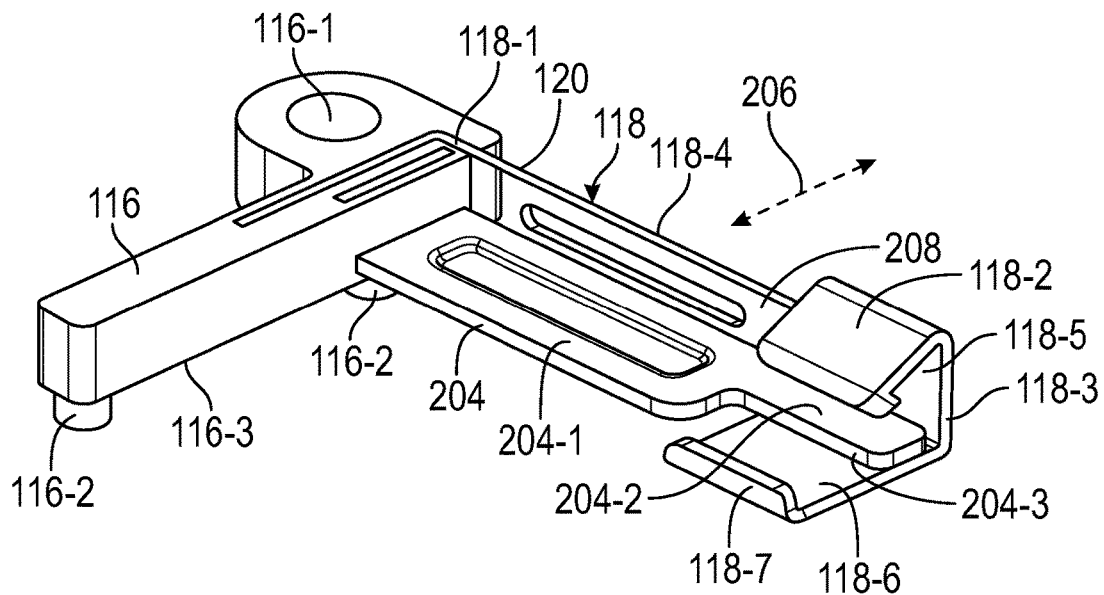
FIG. 2 is a perspective view of a tool-less attachment mechanism, according to some examples.
Figure 3:
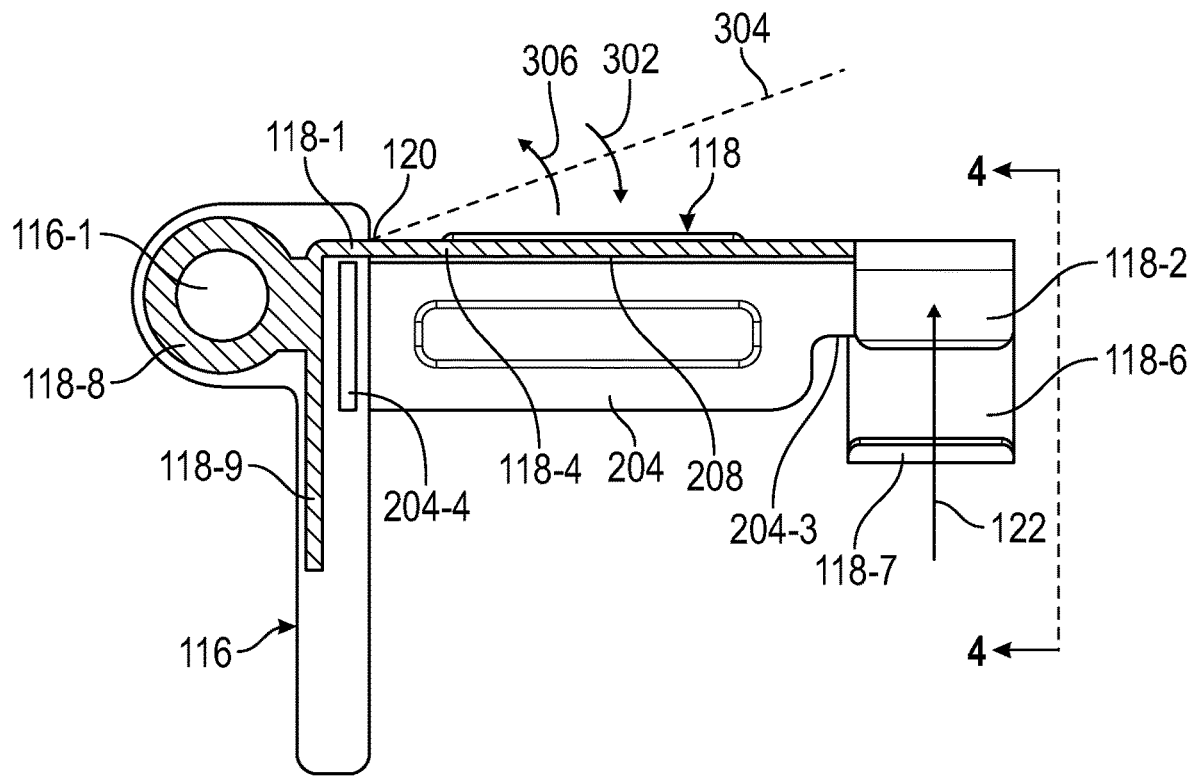
FIG. 3 is a top view of the tool-less attachment mechanism, according to some examples.
Figure 4:
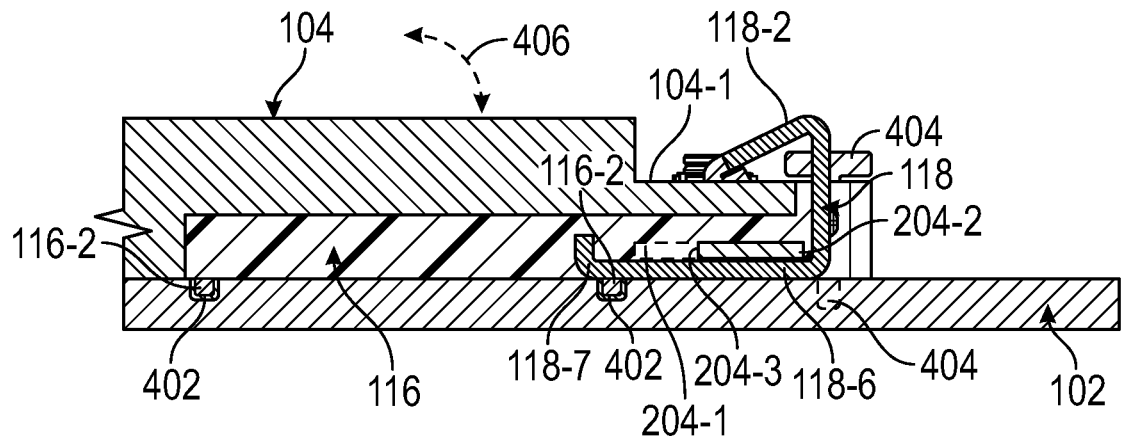
FIG. 4 is a side view of a portion of the tool-less attachment mechanism that attaches an electronic component to a circuit board, in accordance with some examples.

FIG. 2 is a perspective view of the tool-less attachment mechanism according to some examples of the present disclosure. FIG. 3 is a top view of the tool-less attachment mechanism. FIG. 4 is a side view of an assembly that includes the circuit board 102, the M.2 electronic component 104, and the tool-less attachment mechanism that attaches the M.2 electronic component 104 to the circuit board 102, in accordance with some examples.

FIGS. 2-4 are discussed together below.

As shown in FIG. 2, bosses 116-2 depend from a lower surface 116-3 of the bracket 116. Each boss 116-2 is a downwardly protruding member that depends from the lower surface 116-3 of the bracket 116. As shown in FIG. 4, the bosses 116-2 are received in respective holes 402 formed in the upper surface 110 of the circuit board 102. The bosses 116-2 when engaged in the holes 402 prevent movement of the bracket 116 relative to the circuit board 102.

The engagement tab 118-2 is part of the engagement segment 118-3 of the spring-loaded arm 118. The engagement segment 118-3 has a back wall 118-5 and a bottom plate 118-6 that is integrally attached to the back wall 118-5. The bottom plate 118-6 is generally perpendicular to the back wall 118-5 in some examples. In other examples, the bottom plate 118-6 can have a different angle with respect to the back wall 118-5. The back wall 118-5 can be part of the elongated member 118-4 of the spring-loaded arm 118.

At a rear portion of the bottom plate 118-6 (the rear portion is opposite a front portion of the bottom plate 118-6 attached to the back wall 118-5), a raised hook protrusion 118-7 rises above an upper surface of the bottom plate 118-6.

The tool-less attachment mechanism further includes a rotation stop 204, which is in the form of a plate in some examples. The rotation stop 204 has a wide portion 204-1 and a narrow portion 204-2. The narrow portion 204-2 has a width along an axis 206 that is less than a width of the wide portion 204-1 along the axis 206.

The rotation stop 204 is to stop rotation of the spring-loaded arm 118 along two different rotational directions.

When the spring-loaded arm 118 rotates about the pivot point 120 in a first rotational direction 302 (i.e., the spring-loaded arm 118 rotates from the release position (304) to the engaged position shown in FIGS. 2-3), a front surface 208 of the elongated member 118-4 of the spring-loaded arm 118 impacts an edge portion of the rotation stop 204 to prevent the spring-loaded arm 118 from further rotation in the rotational direction 302 past the position of the spring-loaded arm 118 shown in FIGS. 2-3.

When the spring-loaded arm 118 rotates in the opposite rotation direction 306 (from the engaged position to the release position 304), the raised hook protrusion 118-7 engages an edge portion 204-3 of the rotation stop 204 to prevent further rotation of the spring-loaded arm in the rotational direction 306.

In some examples, the spring-loaded arm 118 is attached to the bracket 116 by over-molding the bracket 116 onto a portion of the spring-loaded arm 118. As shown in FIG. 3, the first end portion 118-1 of the spring-loaded arm 118 is integrally attached to a ring-shaped segment 118-8 and an engagement segment 118-9. The ring-shaped segment 118-8 has an opening that coincides with the through-hole 116-1 of the bracket 116. The engagement segment 118-9 is angled (e.g., approximately right angled) with respect to the elongated member 118-4 of the spring-loaded arm 118. The bracket 116 is over-molded onto the ring-shaped segment 118-8 and the engagement segment 118-9, so that the ring-shaped segment 118-8 and the engagement segment 118-9 becomes molded together with the bracket 116.

An over-molding process refers to an injection molding process where a first component is molded over another component. In this case, the bracket 116 (e.g., formed of a plastic or another material) is over-molded over a portion of the spring-loaded arm 118 (formed of a metal or another material). By molding the bracket 116 with the portion of the spring-loaded arm 118, a reliable attachment is provided between the bracket 116 and the spring-loaded arm 118.

Similarly, the bracket 116 is over-molded over a portion 204-4 of the rotation stop 204, to attach the rotation stop 204 to the bracket 116.

As further shown in FIG. 4, a screw or another fastener 404 extends through the through-hole 116-1 of the bracket 116, and penetrates through a portion of the circuit board 102 (or through the entirety of the circuit board 102) to attach the bracket 116 to the circuit board 102.

When the spring-loaded arm 118 is moved to the release position 304 (FIG. 3), a user can remove the M.2 electronic component 104 from the circuit board 102. In some examples, the connection of the electrical connectors 112 and 114 (FIG. 1A) is such that the M.2 electronic component 104 can be pivoted along a rotational axis 406. To remove the M.2 electronic component 104 when the spring-loaded arm 118 is at the release position 304, the user can pivot the M.2 electronic component 104 upwardly along the rotational axis 406 away from the circuit board 102, following which the user can disconnect the electrical connector 114 of the M.2 electronic component 104 from the electrical connector 112 on the circuit board 102. To mount the M.2 electronic component 104, while the spring-loaded arm 118 is at the release position 304, the user can pivot the M.2 electronic component 104 (whose electrical connector 114 is mated with the electrical connector 112 on the circuit board 102) downwardly along the rotational axis 406 to engage the M.2 electronic component 104 with the upper surface 110 of the circuit board 102. At that point, the user can release the spring-loaded arm 118, which returns from its release position 304 to the engaged position shown in FIG. 3.

Figure 5:
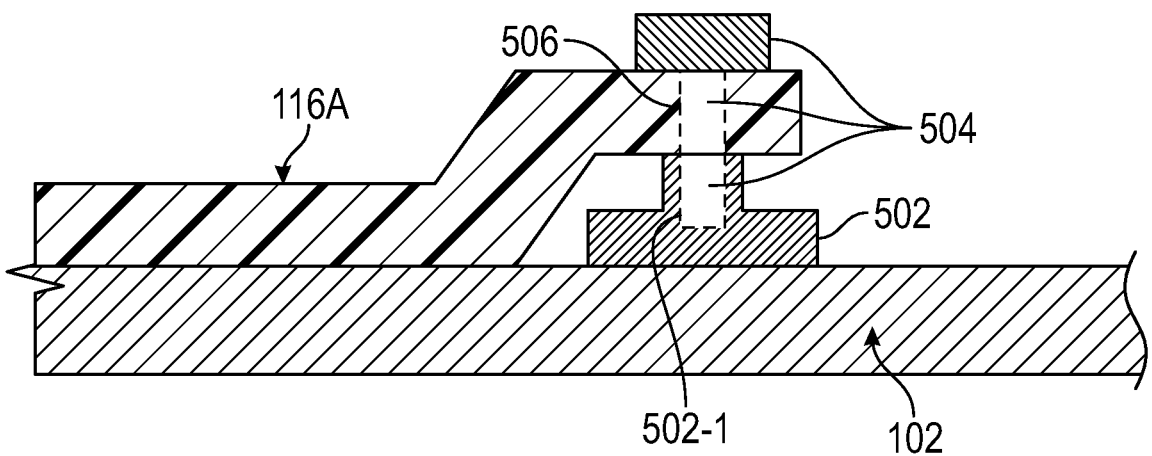
FIG. 5 is a sectional view of a portion of a tool-less attachment mechanism and a circuit board, according to further examples.

In other examples, the bracket 116 can be attached to the circuit board without penetrating deeply into the circuit board 102. FIG. 5 shows an example in which a lower surface of a surface-mount boss 502 can be adhered to the upper surface 110 of the circuit board 102, such as by use of an adhesive, for example. The surface-mount boss 502 is adhered to the upper surface 110 of the circuit board 102 without use of a fastener that penetrates into the circuit board 102. The surface-mount boss 502 has a threaded opening 502-1 to receive a screw or another fastener 504 that is passed through a through-hole 506 of a bracket 116A.

Figure 6:
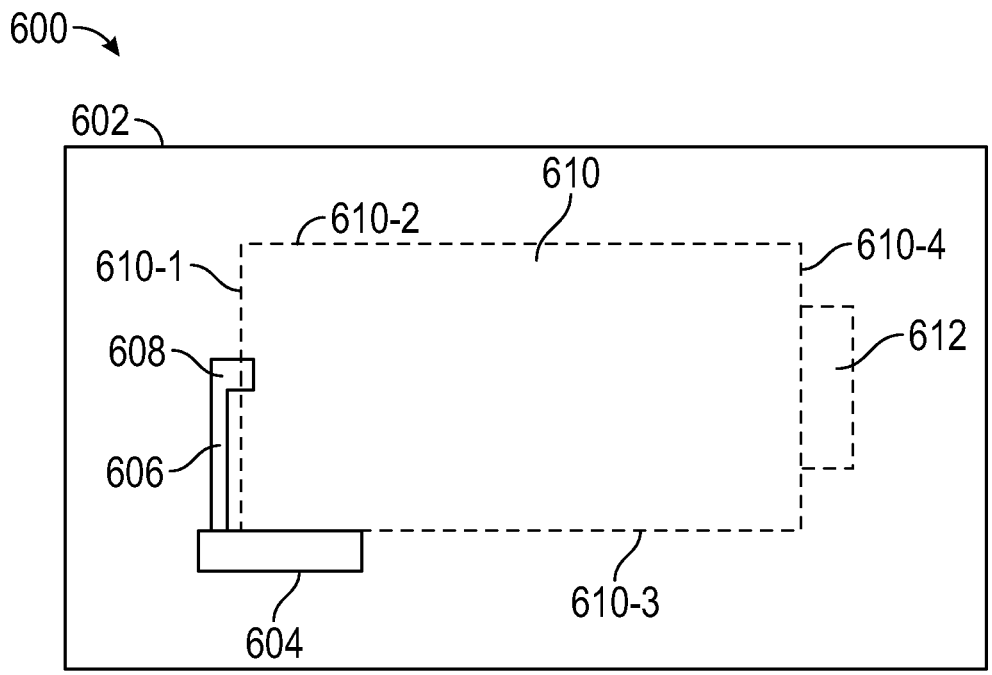
FIG. 6 is a block diagram of a circuit board assembly according to some examples.

FIG. 6 is a block diagram of a circuit board assembly 600 (e.g., the circuit board assembly 100 of FIGS. 1A-1B). The circuit board assembly 600 includes a circuit board 602 and a bracket 604 affixed to the circuit board 602. The circuit board assembly 600 further includes a spring-loaded arm 606 attached to the bracket 604. In some examples, the spring-loaded arm 606 is separate from the bracket 604 and is connected to the bracket 604, such as by over-molding as discussed above. In other examples, the spring-loaded arm 606 is integrally formed with the bracket 604—i.e., the spring-loaded arm 606 and the bracket 604 are part of a single piece.

The spring-loaded arm 606 has an angled engagement tab 608 to engage an upper surface of an electronic component 610 at a first end 610-1 of the electronic component 610 that is to mount to the circuit board 602. The bracket 604 and the spring-loaded arm 606 are arranged to stay clear of keep-out zones of side portions 610-2 and 610-3 of the electronic component 610 that extend between the first end 610-1 and a second end 610-4 with an electrical connector 612 of the electronic component 610.

In some examples, the circuit board 602 includes electrically conductive traces in a region between a first location of the first electronic component 610 and a second location of a second electronic component. The bracket 604 is affixed to the circuit board 602 at a location that is outside the region with the electrically conductive traces.

In some examples, the spring-loaded arm 606 is actuatable between an engaged position and a release position by a user without use of a tool, where in the engaged position the angled engagement tab 608 is engaged to the upper surface of the first electronic component 610, and wherein in the release position the angled engagement tab 608 is disengaged from the upper surface of the first electronic component 610.

In some examples, the spring-loaded arm 606 is formed of a first material that is elastic, and the bracket 604 is formed of a different second material that is rigid.

Figure 7:
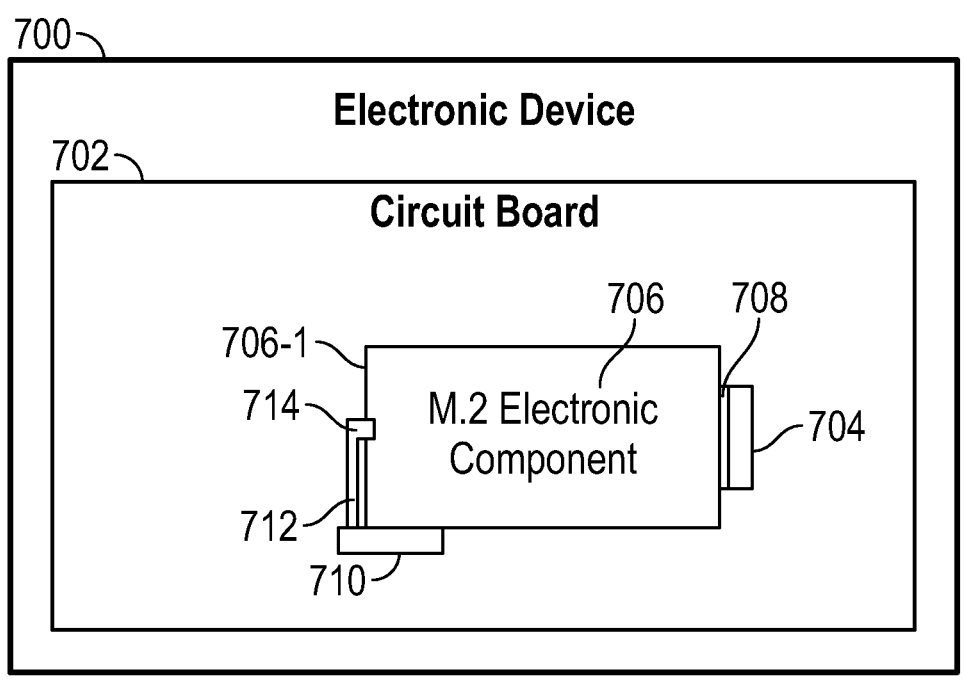
FIG. 7 is a block diagram of an electronic device according to some examples.

FIG. 7 is a block diagram of an electronic device 700 that includes a circuit board 702 having a first electrical connector 704. In some examples, the electronic device 700 can include a computer (e.g., a desktop computer, a notebook computer, a tablet computer, a server computer, etc.), a smartphone, a game appliance, an Internet-of-Things (IoT) device, and so forth.

The electronic device 700 further includes an M.2 electronic component 706 mounted to the circuit board 702 and having a second electrical connector 708 to connect to the first electrical connector 704.

The electronic device 700 that includes a bracket 710 affixed to the circuit board 702, and a spring-loaded arm 712 attached to the bracket 710. The spring-loaded arm 712 has an angled engagement tab 714 to engage an upper surface of the M.2 electronic component 706 at a first end 706-1 of the M.2 electronic component 706 when the second electrical connector 708 of the M.2 electronic component 706 is connected to the first electrical connector 704.

Figure 8:
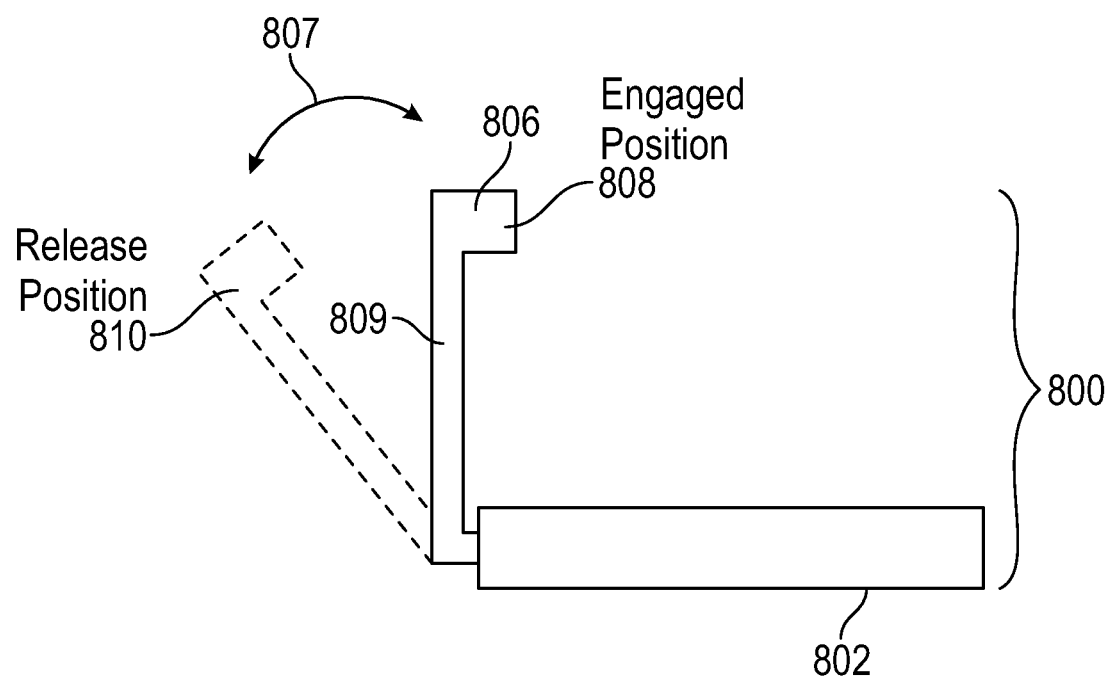
FIG. 8 is a block diagram of a tool-less electronic component retention apparatus, according to some examples.

FIG. 8 is a block diagram of a tool-less electronic component retention apparatus 800 according to some examples of the present disclosure. The tool-less electronic component retention apparatus 800 includes a bracket 802 to affix to a circuit board, and a spring-loaded arm 804 attached to the bracket 802. The spring-loaded arm 804 has an engagement tab 806 that is angled downwardly to engage an upper surface of an electronic component to mount the electronic component to the circuit board, where the spring-loaded arm 804 is pivotable (along a rotational axis 807) between an engaged position 808 and a release position 810 by a user without use of a tool. In the engaged position 808, the engagement tab 806 is engaged to the upper surface of the electronic component, and in the release position 810 the engagement tab 806 is disengaged from the upper surface of the electronic component.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A circuit board assembly comprising:
a circuit board;
a bracket affixed to the circuit board;
a spring-loaded arm attached to the bracket, the spring-loaded arm having an angled tab to engage an upper surface of a first electronic component at a first end of the first electronic component that is to mount to the circuit board, the bracket and the spring-loaded arm arranged to stay clear of side portions of the first electronic component that extend between the first end and a second end with an electrical connector of the first electronic component; and
a stop that blocks further rotation of the spring-loaded arm in a direction from a release position to an engaged position when the spring-loaded arm pivots from the release position to the engaged position, and wherein the stop blocks further rotation of the spring-loaded arm from the engaged position to the release position.

2. The circuit board assembly of claim 1, wherein the circuit board includes electrically conductive traces in a region between a first location of the first electronic component and a second location of a second electronic component,
wherein the bracket is affixed to the circuit board at a location that is outside the region with the electrically conductive traces.

3. The circuit board assembly of claim 1, wherein the spring-loaded arm is actuatable between the engaged position and the release position by a user without use of a tool, wherein in the engaged position the angled tab is engaged to the upper surface of the first electronic component, and wherein in the release position the angled tab is disengaged from the upper surface of the first electronic component.

4. The circuit board assembly of claim 3, wherein the spring-loaded arm is pivotable between the engaged position and the release position.

5. The circuit board assembly of claim 1, wherein the spring-loaded arm comprises a hook protrusion to engage the stop when the spring-loaded arm is pivoted from the engaged position to the release position.

6. The circuit board assembly of claim 3, wherein the angled tab is angled downwardly with respect to the upper surface of the first electronic component.

7. The circuit board assembly of claim 3, wherein in the release position the first electronic component is pivotable downwardly where a release of the spring-loaded arm by the user allows the spring-loaded arm to move from the release position to the engaged position.

8. The circuit board assembly of claim 1, wherein the bracket is over-molded onto a portion of the spring-loaded arm.

9. The circuit board assembly of claim 8, wherein the spring-loaded arm is formed of a first material that is elastic, and the bracket is formed of a different second material that is rigid.

10. The circuit board assembly of claim 1, further comprising:
a surface-mount boss adhered to a surface of the circuit board,
wherein the bracket is attached to the surface-mount boss by a fastener.

11. An electronic device comprising:
a circuit board comprising a first electrical connector;
an M.2 electronic component mounted to the circuit board and comprising a second electrical connector to connect to the first electrical connector;
a bracket affixed to the circuit board;
a spring-loaded arm attached to the bracket, the spring-loaded arm having an angled tab to engage an upper surface of the M.2 electronic component at a first end of the M.2 electronic component when the second electrical connector of the M.2 electronic component is connected to the first electrical connector, and
a stop that blocks further rotation of the spring-loaded arm in a direction from a release position to an engaged position when the spring-loaded arm pivots from the release position to the engaged position, and wherein the stop blocks further rotation of the spring-loaded arm from the engaged position to the release position.

12. The electronic device of claim 11, wherein the spring-loaded arm is pivotable between the engaged position and the release position by a user without use of a tool, wherein in the engaged position the angled tab is engaged to the upper surface of the M.2 electronic component, and wherein in the release position the angled tab is disengaged from the upper surface of the M.2 electronic component, and wherein the angled tab is angled downwardly with respect to the upper surface of the M.2 electronic component.

13. A tool-less electronic component retention apparatus, comprising:
   a bracket to affix to a circuit board;
   a spring-loaded arm attached to the bracket, the spring-loaded arm having an engagement tab that is angled downwardly to engage an upper surface of an electronic component to mount the electronic component to the circuit board, wherein the spring-loaded arm is pivotable between an engaged position and a release position by a user without use of a tool, wherein in the engaged position the engagement tab is engaged to the upper surface of the electronic component, and wherein in the release position the engagement tab is disengaged from the upper surface of the electronic component, and
   a stop that blocks further rotation of the spring-loaded arm in a direction from the release position to the engaged position when the spring-loaded arm pivots from the release position to the engaged position, and wherein the stop blocks further rotation of the spring-loaded arm from the engaged position to the release position.

14. The tool-less electronic component retention apparatus of claim 13,
   wherein the spring-loaded arm comprises a protrusion to engage the stop when the spring-loaded arm is pivoted from the engaged position to the release position.

15. The circuit board assembly of claim 1, wherein a portion of the stop is received within a portion of the spring-loaded arm.

16. The electronic device of claim 11, wherein a portion of the stop is received within a portion of the spring-loaded arm.

17. The tool-less electronic component retention apparatus of claim 13, wherein a portion of the stop is received within a portion of the spring-loaded arm.

* * * * *